United States Patent
Delgado et al.

(10) Patent No.: US 8,872,328 B2
(45) Date of Patent: Oct. 28, 2014

(54) INTEGRATED POWER MODULE PACKAGE

(71) Applicant: General Electric Company, Schenectady, NY (US)

(72) Inventors: Eladio Clemente Delgado, Burnt Hills, NY (US); John Stanley Glaser, Niskayuna, NY (US); Brian Lynn Rowden, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/720,351

(22) Filed: Dec. 19, 2012

(65) Prior Publication Data

US 2014/0167248 A1   Jun. 19, 2014

(51) Int. Cl.
  *H01L 23/46*   (2006.01)
  *H05K 7/20*    (2006.01)
  *H01L 25/00*   (2006.01)

(52) U.S. Cl.
  CPC .............. *H01L 23/46* (2013.01); *H01L 25/50* (2013.01)
  USPC ........... 257/699; 257/713; 257/714; 257/716; 257/719; 257/721; 257/E23.08; 257/E23.01; 257/70; 257/690; 257/E23.077; 257/712; 257/717; 257/704; 257/707; 257/728

(58) Field of Classification Search
  USPC ......... 257/712, 713, 717, 714, 716, 719, 721, 257/686, 685, 700, 701, 758, 704, 707, 728, 257/723, 724, 699, 681, 731, E23.01, 257/E23.08, 703, 690, E23.077
  See application file for complete search history.

(56) References Cited

U.S. PATENT DOCUMENTS

| | | | |
|---|---|---|---|
| 6,087,682 A | 7/2000 | Ando | |
| 6,377,461 B1 * | 4/2002 | Ozmat et al. | 361/704 |
| 7,518,236 B2 * | 4/2009 | Delgado et al. | 257/723 |
| 7,745,930 B2 | 6/2010 | Connah et al. | |
| 7,846,779 B2 | 12/2010 | Yang | |
| 7,863,725 B2 | 1/2011 | Jong et al. | |
| 7,923,833 B2 * | 4/2011 | Furukawa et al. | 257/705 |
| 8,014,151 B2 * | 9/2011 | Jerg et al. | 361/707 |
| 8,018,056 B2 * | 9/2011 | Hauenstein | 257/730 |
| 8,125,781 B2 * | 2/2012 | Mamitsu et al. | 361/702 |

(Continued)

OTHER PUBLICATIONS

S. Wen, "Thermal and Thermo-Mechanical Analyses of Wire Bond vs. Three-dimensionally Packaged Power Electronics Modules," Thesis—Master of Science in Materials Science & Engineering, Dec. 16, 1999.

*Primary Examiner* — Alexander Oscar Williams
(74) *Attorney, Agent, or Firm* — John P. Darling

(57) ABSTRACT

An integrated power module includes a substantially planar insulated metal substrate having at least one cut-out region; at least one substantially planar ceramic substrate disposed within the cut-out region, wherein the ceramic substrate is framed on at least two sides by the insulated metal substrate, the ceramic substrate including a first metal layer on a first side and a second metal layer on a second side; at least one power semiconductor device coupled to the first side of the ceramic substrate; at least one control device coupled to a first surface of the insulated metal substrate; a power overlay electrically connecting the at least one semiconductor power device and the at least one control device; and a cooling fluid reservoir operatively connected to the second metal layer of the at least one ceramic substrate, wherein a plurality of cooling fluid passages are provided in the cooling fluid reservoir.

11 Claims, 5 Drawing Sheets

(56) References Cited

U.S. PATENT DOCUMENTS

| | | | |
|---|---|---|---|
| 8,248,809 B2* | 8/2012 | Miller et al. | 361/752 |
| 8,431,445 B2* | 4/2013 | Robert | 438/122 |
| 2007/0090464 A1* | 4/2007 | Delgado et al. | 257/369 |
| 2008/0291636 A1* | 11/2008 | Mori et al. | 361/709 |
| 2009/0109624 A1* | 4/2009 | Chan et al. | 361/702 |
| 2009/0174063 A1* | 7/2009 | Furukawa et al. | 257/703 |
| 2009/0200065 A1* | 8/2009 | Otoshi et al. | 174/252 |
| 2009/0218666 A1 | 9/2009 | Yang | |
| 2010/0053889 A1* | 3/2010 | Miller et al. | 361/689 |
| 2010/0277868 A1* | 11/2010 | Beaupre et al. | 361/700 |
| 2011/0100681 A1 | 5/2011 | Kimmich et al. | |
| 2011/0101394 A1 | 5/2011 | McKenzie et al. | |
| 2011/0141690 A1* | 6/2011 | Le et al. | 361/689 |
| 2011/0204408 A1 | 8/2011 | McKenzie et al. | |
| 2013/0148301 A1* | 6/2013 | Dede et al. | 361/702 |
| 2013/0256867 A1* | 10/2013 | Mori et al. | 257/712 |

* cited by examiner

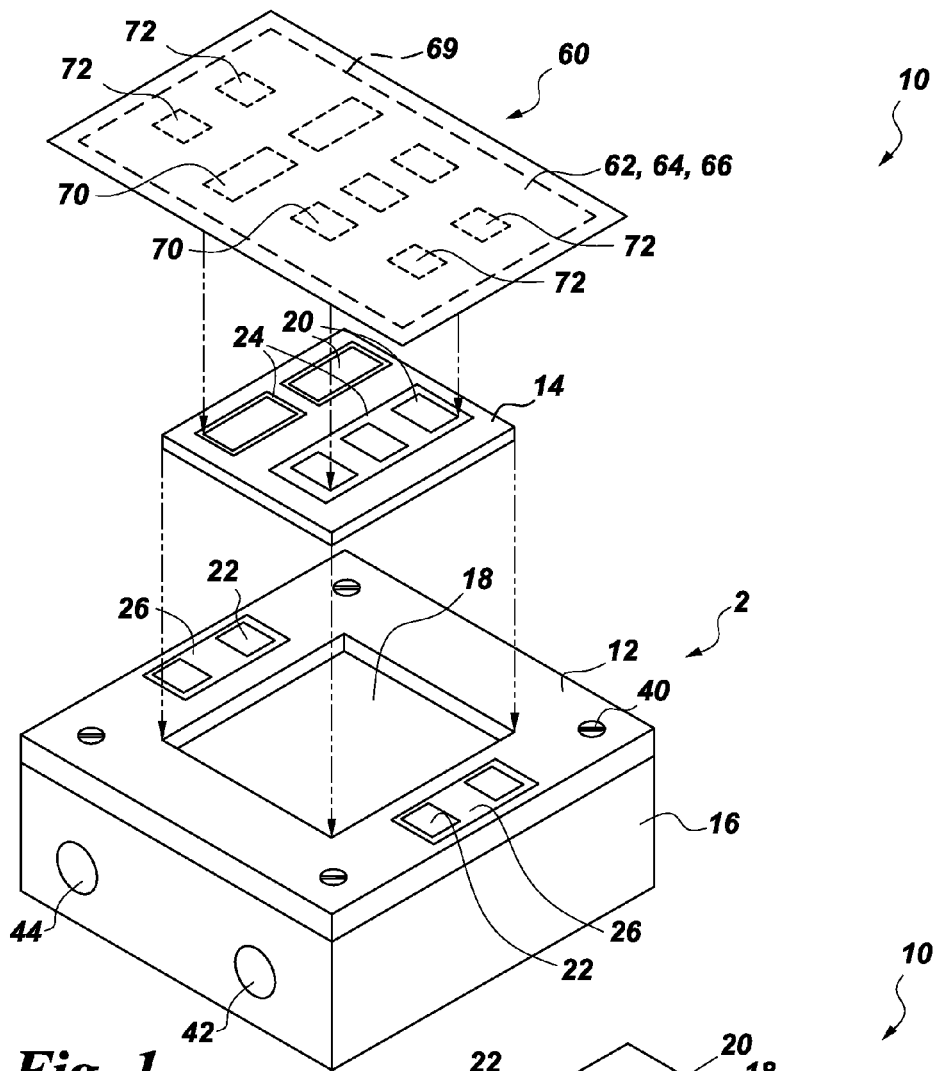
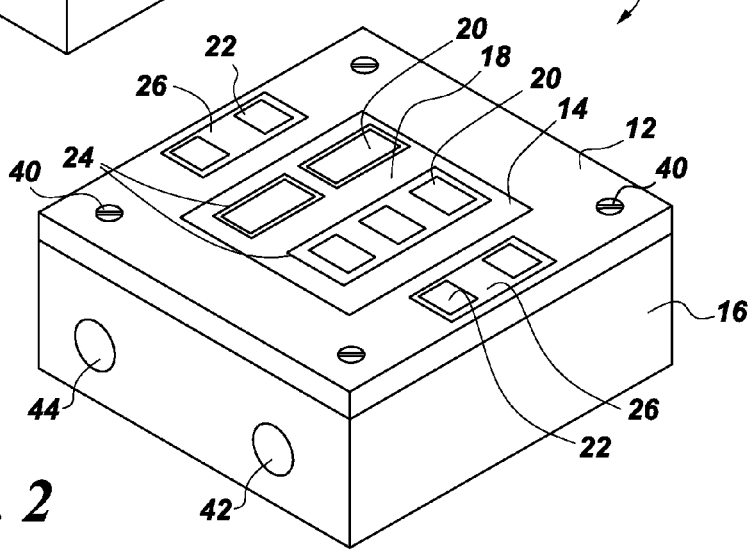
Fig. 1
Fig. 2

INTEGRATED POWER MODULE PACKAGE

BACKGROUND

The present technology relates generally to electronic packaging, and in some examples, to power electronic packages applicable to power semiconductor devices that provide high device performance and high thermal performance.

To fully utilize the capabilities of high-power semiconductor devices, there is a need to provide the electrical, structural, and thermal environments compatible with their packaging requirements. The development of advanced devices has made it increasingly more difficult to cool power semiconductor devices. Generally, high-power semiconductor devices are packaged with brazed or direct bond copper (DBC). Such packaging is expensive and thus typically limited to high performance applications. Some cost has been lowered by reducing the amount of substrate material, and some reliability has increased when power overlay assemblies such as described in commonly assigned Ozmat et al. U.S. Pat. No. 6,377,461 are used to replace wire bonds. In addition, some power electronics packaging techniques have also incorporated milli-channel technologies in substrates to improve thermal performance in power modules.

One technology that gives an economic way to provide a high degree of heat dissipation is insulated metal substrate technology, commonly referred to as IMS. A typical insulated metal substrate comprises at least one metal support substrate, generally aluminum alloy, on which electro-conducting metal, generally copper, is adhered by means of a layer of electrically-insulating and thermally-conducting material. However, in power electronics, the heat dissipation provided by the insulated metal substrate technology is typically less than DBC technology, and it may be inadequate in certain applications to ensure that there is no thermal fatigue.

It would therefore be desirable to provide a cost effective power electronics package that further advances state of the art power module thermal performance while simultaneously providing superior electrical functionality characteristics. Additional costs savings and reliability improvements would also be desirable.

BRIEF DESCRIPTION

In accordance with one example, a power module comprises an integrated power module, comprising a substantially planar insulated metal substrate having at least one cut-out region; at least one substantially planar ceramic substrate disposed within the cut-out region, wherein the ceramic substrate is framed on at least two sides by the insulated metal substrate, the ceramic substrate including a first metal layer on a first side and a second metal layer on a second side; at least one power semiconductor device coupled to the first side of the ceramic substrate; at least one control device coupled to a first surface of the insulated metal substrate; a power overlay electrically connecting the at least one semiconductor power device and the at least one control device; and a cooling fluid reservoir operatively connected to the second metal layer of the at least one ceramic substrate, wherein a plurality of cooling fluid passages are provided in the cooling fluid reservoir.

In accordance with another example, a method of fabricating a power module comprises assembling at least one ceramic substrate within a cut-out region of an insulated metal substrate in a fixture; dispensing loading epoxy on the insulated metal substrate; dispensing solder paste onto the insulated metal substrate and the at least one ceramic substrate; placing components on the insulated metal substrate and the at least one ceramic substrate; providing a power overlay configured to electrically connect the components of the insulated metal substrate to the components of the at least one ceramic substrate; and reflowing the solder paste to connect the power overlay to the insulated metal substrate and the at least one ceramic substrates while connecting the components to the insulated metal substrate and the at least one ceramic substrate.

DRAWINGS

These and other features, aspects, and advantages of the present technology will become better understood when the following detailed description is read with reference to the accompanying drawings in which like characters represent like parts throughout the drawings, wherein:

FIG. 1 is an exploded assembly view illustrating an integrated power module that includes an insulated metal substrate (IMS), a ceramic substrate, and a power overlay (POL) according to one example;

FIG. 2 is a perspective assembly view illustrating the integrated power module of FIG. 1 including the insulated metal substrate (IMS) the ceramic substrate, according to one example;

Figure 3:
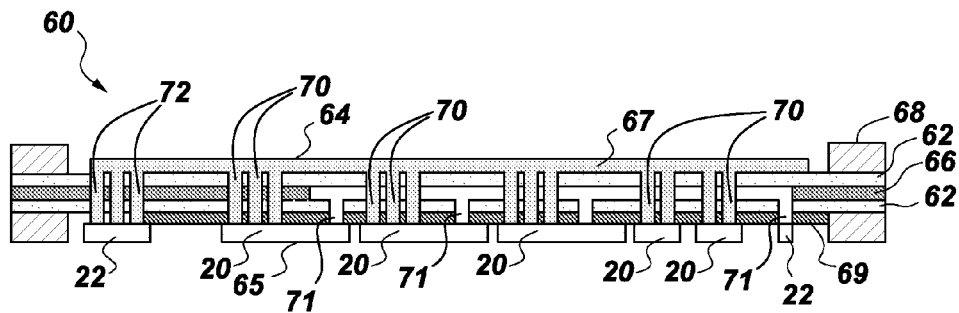
FIG. 3 is a side view of a multi-layer POL prior to singulation from the process frame and mounting to the IMS and ceramic substrate.

While the above-identified drawing figures set forth alternative examples, other examples of the present technology are also contemplated, as noted in the discussion. In all cases, this disclosure presents illustrated examples of the present technology by way of representation and not limitation. Numerous other modifications and examples can be devised by those skilled in the art which fall within the scope and spirit of the principles of this technology.

The disclosure includes examples that relate to an integrated power module that includes an insulated metal substrate (IMS), a ceramic substrate, and a heat sink operatively coupled to an IMS and the ceramic substrate. At least a power semiconductor device is bonded to a planar interconnect (POL) and then to the surface of the ceramic substrate, and at least a control device is bonded to the IMS. A window is formed in the IMS to allow the ceramic substrate to directly contact the heat sink. The power module, thus packed, advantageously provides high electrical performance and high thermal performance at reduced cost, and thereby makes it attractive to a wider range of applications, e.g., aviation, medical systems, and energy.

DETAILED DESCRIPTION

One or more specific examples are described herein, and in an effort to provide a concise description of these examples, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another.

When introducing elements of various examples of the present disclosure, the articles "a," "an," "the," and "said" are intended to mean that there are one or more of the elements. The terms "comprising," "including," and "having" are intended to be inclusive and mean that there may be additional elements other than the listed elements. Moreover, the use of "top," "bottom," "above," "below," and variations of these terms is made with reference to the drawings and for convenience, but does not require any particular orientation of the components unless otherwise stated. As used herein, the terms "disposed on" or "mounted on" refer to both secured or disposed directly in contact with and indirectly by having intervening layers therebetween.

As used herein, the term "and/or" includes any and all combinations of the listed items.

Unless otherwise stated, approximating language may be applied to modify any quantitative representation that could permissibly vary without resulting in a change in the basic function to which it may be about related. Accordingly, a value modified by a term such as "about" is not limited to the precise value specified. In some instances, the approximating language may correspond to the precision of an instrument for measuring the value.

A "substantially planar surface", as defined herein, usually refers to a substantially flat surface. The surface can be smooth, although it may include a relatively minor degree (e.g., about 20% of the total surface area) of texture (e.g., roughness), indentations, and various irregularities. In some examples, the substrate can exhibit flexibility. Moreover, in some examples, the surface of the substrate may be curved—usually with a relatively large radius of curvature.

FIG. 1 and FIG. 2 show a perspective top view illustrating a semiconductor power module 10 that includes a substantially planar insulated metal substrate (IMS) 12 and a substantially planar ceramic substrate 14, a power overlay (POL) 60, and a heatsink 16 according to one example. The POL 60 is not shown in FIG. 2 for clarity. The IMS 12 has an insulating material layer 13 and at least one cut-out region 18, and the ceramic substrate 14 is disposed within the cut-out region 18 such that the ceramic substrate 14 is framed on at least two sides by the IMS 12. In one example, the ceramic substrate 14 is framed on all sides by the IMS 12. FIG. 2 illustrates a top view of the semiconductor power module 10, when the ceramic substrate 14 is placed within the cut-out region 18 of the IMS 12. The IMS 12 thus forms a frame around the ceramic substrate 14, and this assembly may also be referred to a composite substrate assembly 2. In some other examples, the IMS substrate 12 may have more than one cut-out region, each containing a ceramic substrate 14. The shape and size of the cut-out region 18 is such as to match the ceramic substrate 14. However, the ceramic substrate 14 may differ in shape and size of the cut-out region 18, in some other examples.

The power module 10 in one example also includes one or more power semiconductor devices 20 coupled to the ceramic substrate 14, and one or more interconnecting interposers, or shims, 22 coupled to the top metallization on the IMS 12 which then provides connections to the modules input output or connectivity to control devices on the IMS 12. The power semiconductors devices 20 and control devices, not shown for simplicity, and interposer 22 are electrically connected, and are bonded to corresponding conductive patterns 24, 26 integrated into the ceramic substrate 14 and the IMS 12.

Figure 4:
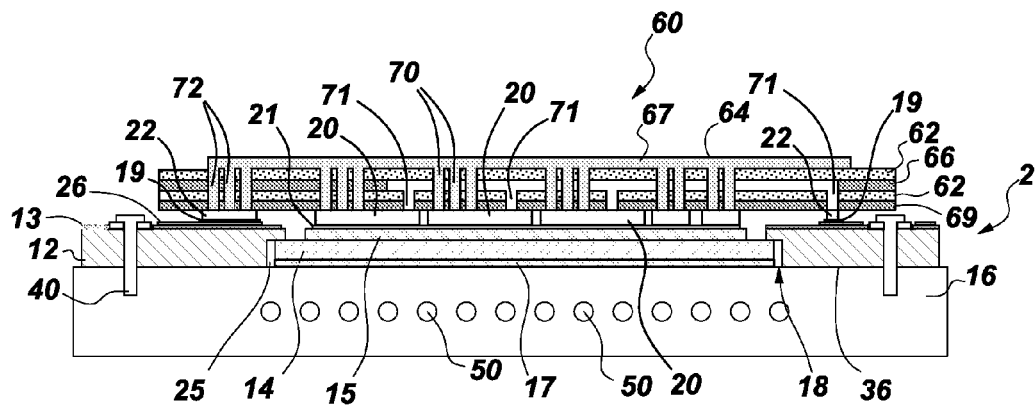
FIG. 4 is a cross section view of the power module depicted in FIG. 1 in which the POL is the multi-layer POL according to FIG. 3.

Referring to FIGS. 1, 3 and 4, the POL 60 as illustrated is a multi-layer POL, although it should be appreciated that a single layer POL may be used. The POL includes an upper or top metallization layer 64, (same as 64), a plurality of dielectric/insulator layers 62, a conductive layer 66 and a layer of adhesive 69. It should be appreciated that adhesive may also be provided between the conductive layer 66 and the dielectric/insulator layers 62. The top metallization layer 64, and/or the conductive layer 66 may be metal, for example copper. A frame 68 is provided to for the purpose of fabricating the POL 60 prior to connection to the ceramic substrate 14 and IMS 12. The POL 60 further includes connection vias 70 to the power devices 20 and connection vias 72 to interposers 22 to make connections to the IMS 12 top metallization 38. The conductive layer 66 of the POL 60 may also include internal vias 71 for providing connections. The dielectric/insulator layers 62 may be, for example, polyimide film (e.g. KAPTON®).

The ceramic substrate 14, in one example includes a substrate that has a top and bottom metal layer 15, 17 bonded to a ceramic layer, bonded to a ceramic substrate. The ceramic layer includes an electrically isolating and thermally conductive material. Non-limiting examples of the material may include aluminum oxide, aluminum nitride, beryllium oxide, and silicon nitride. In a non-limiting example, the metal layers 15, 17 may include copper. Thus, the ceramic substrate 14 may have either a direct bonded copper (DBC), or an active metal braze (AMB) structure. The DBC and AMB refer to processes in which copper layers are directly bonded to a ceramic layer. Alternatively, the metal layers may include other metals, but not limited to, aluminum, gold, silver, and alloy thereof. In one particular example, the ceramic substrate is a DBC.

A plurality of fasteners 40 assists in aligning and securing the composite substrate assembly 2 to the heatsink 16. The heatsink 16, described in further detail below, includes an inlet port 42 and an outlet port 44 that allows flow of a cooling fluid into and from the heatsink through cooling passages 50. According to one aspect, the heatsink 16 is attached via pressurized sealing to the IMS 12 and the ceramic substrate 14.

FIG. 4 is a perspective cross-sectional view, in one example, illustrating a power module as depicted in FIG. 1. The ceramic substrate 14 fits within the cut-out region 18. In one example, the ceramic substrate 14 is disposed in approximately the same horizontal or surface plane as the IMS 12. In one example, the IMS 12 and ceramic substrate 14 have substantially the same thickness so that the top surfaces of the substrates are substantially co-planar, i.e., in approximately single plane. It should be appreciated that the thicknesses of the IMS 12 and the ceramic substrate 14 may be different. As shown in FIG. 4, the top metal layer 15 of the ceramic substrate 14 is substantially co-planar with the top surface of the IMS 12. The thicknesses of the IMS 12 and the ceramic substrate 14 may range according to the specific design and application. The ceramic substrate 14 in one example is disposed within the IMS 12, but is not directly coupled or bonded to the IMS frame 12. The IMS 12 supports and/or positions the ceramic substrate 14, and exerts some pressure on the ceramic substrate 14 to have better thermal contact with the heat sink 16. The ceramic substrate 14 in this example sits in the cut-out region 18, and may not be in physical contact with all the sides of the IMS 12. The composite substrate assembly, so formed, may define a gap 25 between edges or sides of the IMS 12 and the ceramic substrate 14. The gap 25 may allow the ceramic substrate 14 to expand and contract, and in some examples may avoid cracking of the ceramic substrate 14 due to stresses caused during thermal cycling. The gap 25 may be filled with a filler material, e.g. compliant epoxy, to bond the IMS 12 to the ceramic substrate 14.

Referring to FIG. 4, the power semiconductor devices 20 are mounted on the top metal layer 15 of the ceramic substrate 14, and the interposers 72 provide connectivity from the POL 60 top layer 64 to the top layer 38 of the IMS 12. The power semiconductor devices 20 may include a lower, thin metallization layer 65. Solder 19, 21 on the IMS 12 and the ceramic substrate 14, respectively, may be used to join the POL 60 to the composite substrate assembly 2. Although not shown for simplicity, control devices such as gate driver components are bonded and reside in the metal substrate and are connected via top metal IMS layer 38.

These devices are further connected to one another (not shown), and to other components as per operation requirements of the power module 10. A variety of techniques may be used to make required connections. For example, the power module may employ wire bond technology, flip chip technology, MCM technology, or Power Overlay (POL) technology.

In one example, the power module uses the POL 60 for mounting power devices 20 on the ceramic substrate 14. The POL 60 uses an overlay of a polyimide dielectric film(s) 62 and inner conductive layers 66 through which connections 70, 72 provide connections from the devices 20, and interposers 22, respectively to the upper metallization layer 64, to construct several connections. The POL technology offers advantages over other known technologies. High packaging density, low packaging parasitics, high reliability, low weight and size, and high efficiency are some of the advantages of the POL technology.

The power semiconductor devices 20 may be power circuit chips for power conversion or power control such as servo drivers, inverters, power regulators, or converters. For example, the power semiconductor devices 20 may include power metal oxide semiconductor field effect transistors (MOSFETs), bipolar junction transistors (BJTs), insulated-gate bipolar transistors (IGBTs), diodes, or combinations thereof. In other words, the power semiconductor devices 20 may include all or some of the listed items.

The control devices, not shown for simplicity, mounted on the IMS 12 usually include semiconductor chips that can control the operations of the power semiconductor devices 20. Examples of the control devices may include microprocessors, memory, passive devices, such as resistors, or condensers, and/or active devices, such as transistors. One power module may include a few to tens of the control semiconductor chips. The type and number of the control semiconductor chips can be determined according to the type and number of the power semiconductor devices. In addition to control chips, the IMS 12 may further include a supporting electronic device, for example current sensors diodes and other semiconductors.

Figure 5:
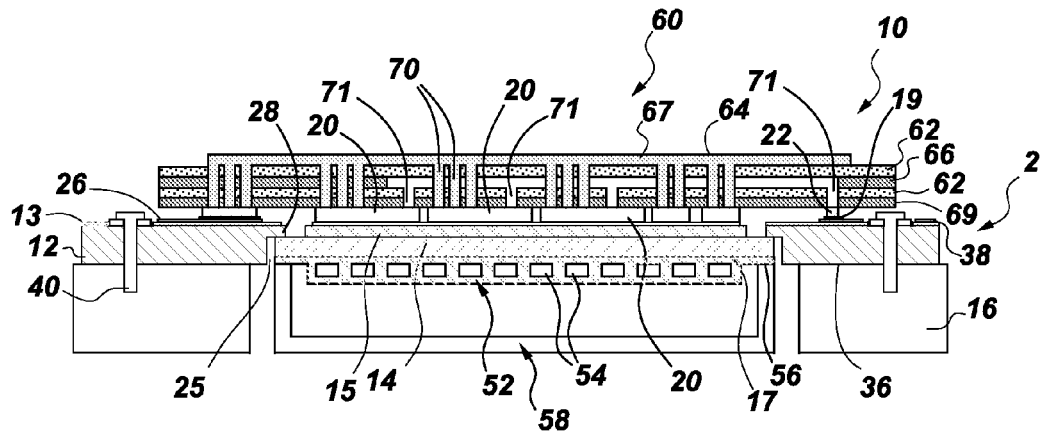
FIG. 5 is a cross section view of a power module according to another example depicting integral cooling.

In some examples, a portion of the IMS 12 protrudes at the edge of the cut-out region 18, as illustrated in FIG. 4 and FIG. 5. This protrusion 28 at the edge of the cut-out region 18 position and/or holds the ceramic substrate 14 in place within the region 18 like a picture frame. The protrusion 28 may further exert pressure on the ceramic substrate 14. In one example, the protrusion 28 may not be bonded with the ceramic substrate 14. In another example, the protrusion 28 of the IMS 12 may be attached with the ceramic substrate 14 by using the filler material to exert sufficient pressure on the ceramic substrate 14.

The design of the composite substrate assembly in one example ensures that a sufficient pressure is uniformly distributed on the ceramic substrate 14 to have good thermal contact of the ceramic substrate to the heatsink 16 and reduce stresses on the ceramic substrate 14. Any shape for the IMS 12 may be used, such as polygon, a circle, a semicircle, an oval or ellipse, a star shape, preferably a shape such that the pressure exerted by the IMS 12 is uniformly distributed on the ceramic substrate 14.

Referring to FIG. 5, milli or micro cooling channels 52 may form cooling fluid passages 54 for cooling fluid. The channels 52 and passages 54 may be formed on the bottom metal layer 17 of the ceramic substrate 14, or they may be formed as part of a cooling fluid reservoir or heat sink 58 that may be attached to or integrally formed with the bottom metal layer 17. For example the cooling fluid reservoir 58 may be attached to the bottom metal layer 17 by a connection 56, such as solder, or a seal or gasket.

Figure 6:
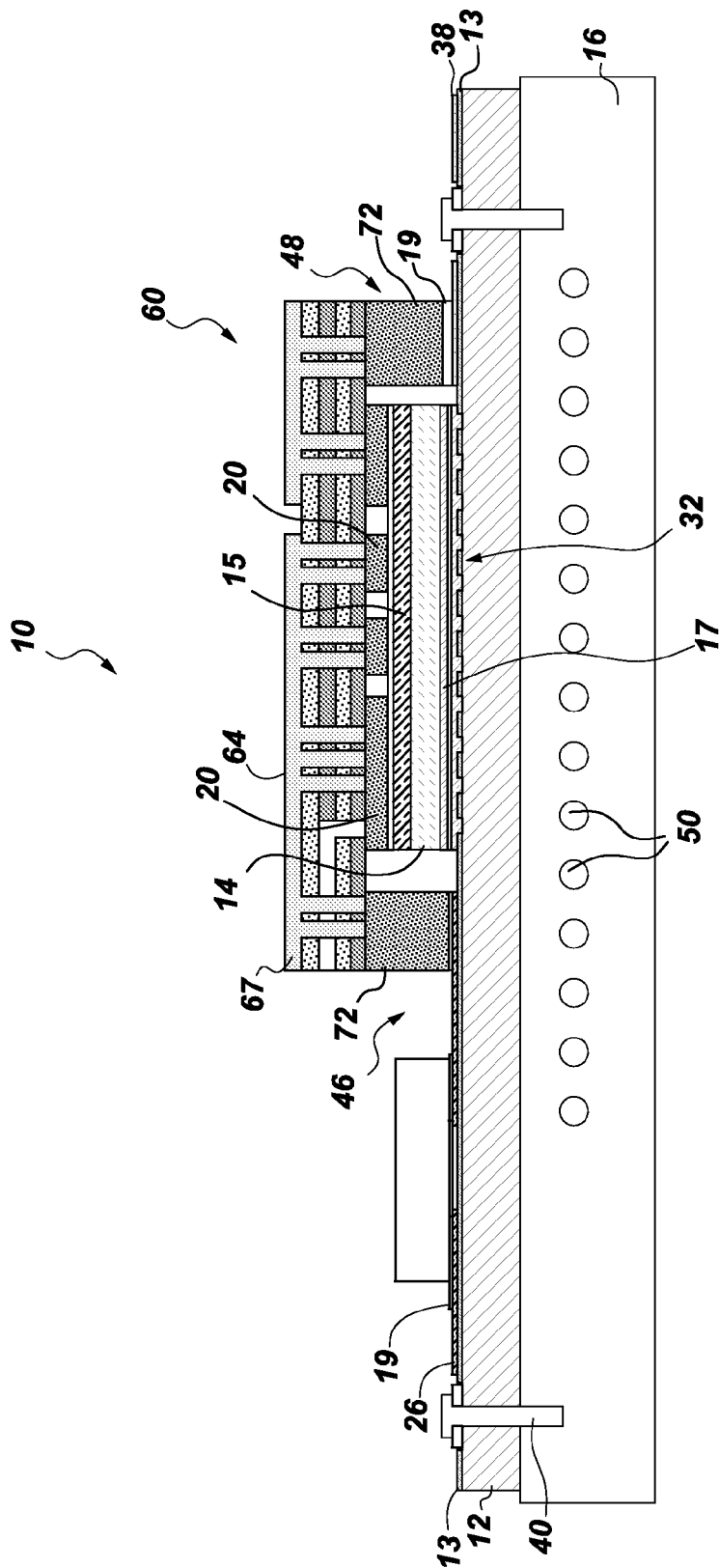
FIG. 6 is a cross section view illustrating a power module according to another example depicting cooling by thermal vias.

Referring to FIG. 6, a power module 10 according to another example includes a source 46 and a drain 48. A plurality of thermal vias 32 are formed between the solder 21 below the bottom metal layer 17 of the ceramic substrate 14 and extending through the insulating material layer 13 of the IMS 12. The thermal vias 32 provide enhanced cooling by directing heat from the POL and the semiconductor power devices to direct metal connections on the IMS metal substrate.

The heatsink 16 in the examples may be operatively coupled to the composite substrate assembly. As used herein, the term "operatively coupled" refers to thermally attaching the heatsink to the composite substrate assembly 2 such that it dissipates heat generated during the operation of the power devices 20. In one example, the heatsink 16 may be coupled to at least the ceramic substrate 14. In another example, the heatsink 16 may be coupled to both the ceramic substrate 14 and the IMS 12. Referring to FIGS. 1-6, the heatsink 16 is generally attached to a bottom surface of the composite substrate assembly 2 that includes the base metal layer of the IMS 12 and the bottom metal layer 17 of the ceramic substrate 14. The plurality of fasteners 40 assists in aligning and securing the composite substrate assembly 2 to the heatsink 16. In one aspect, the heatsink 16 is attached via pressurized sealing to the composite substrate assembly 2. The IMS 12 and the bottom metal layer 17 of the ceramic substrate 14 may contain or consist of, and are not limited to, copper or aluminum. The composite or framed substrate assembly 2 is mounted or attached to the heatsink 16. The heatsink 16 incorporates inlet port 42 and outlet port 44 and associated manifolds to deliver liquid coolant to the cooling fluid channels 50. In another example, the IMS 12 and/or the bottom metal layer 17 of the ceramic substrate 14 may have cooling channels imbedded in order to remove heated coolant from the substrate assembly 2. The result is an integrated power module 10 that has high device performance and high thermal performance.

In some examples, the power module 10 may include more than one heatsink as illustrated in FIGS. 1-6. A heatsink may be attached to the ceramic substrate 14, and a heatsink may be attached to the IMS 12. The two heatsinks may be the same or different, as per heat dissipation requirements. For convenience and accuracy, descriptions of other described features (above and below) are not provided.

Many coolants may be employed for the heat sink(s), and the examples are not limited to a particular coolant. Exemplary coolants include water, ethylene-glycol, propylene-glycol, oil, aircraft fuel and combinations thereof. According to some examples, the coolant comprises a single phase liquid, a multi-phase liquid, or a slurry mixture containing microencapsulated particles, phase change particles, or other materials.

Figure 7:
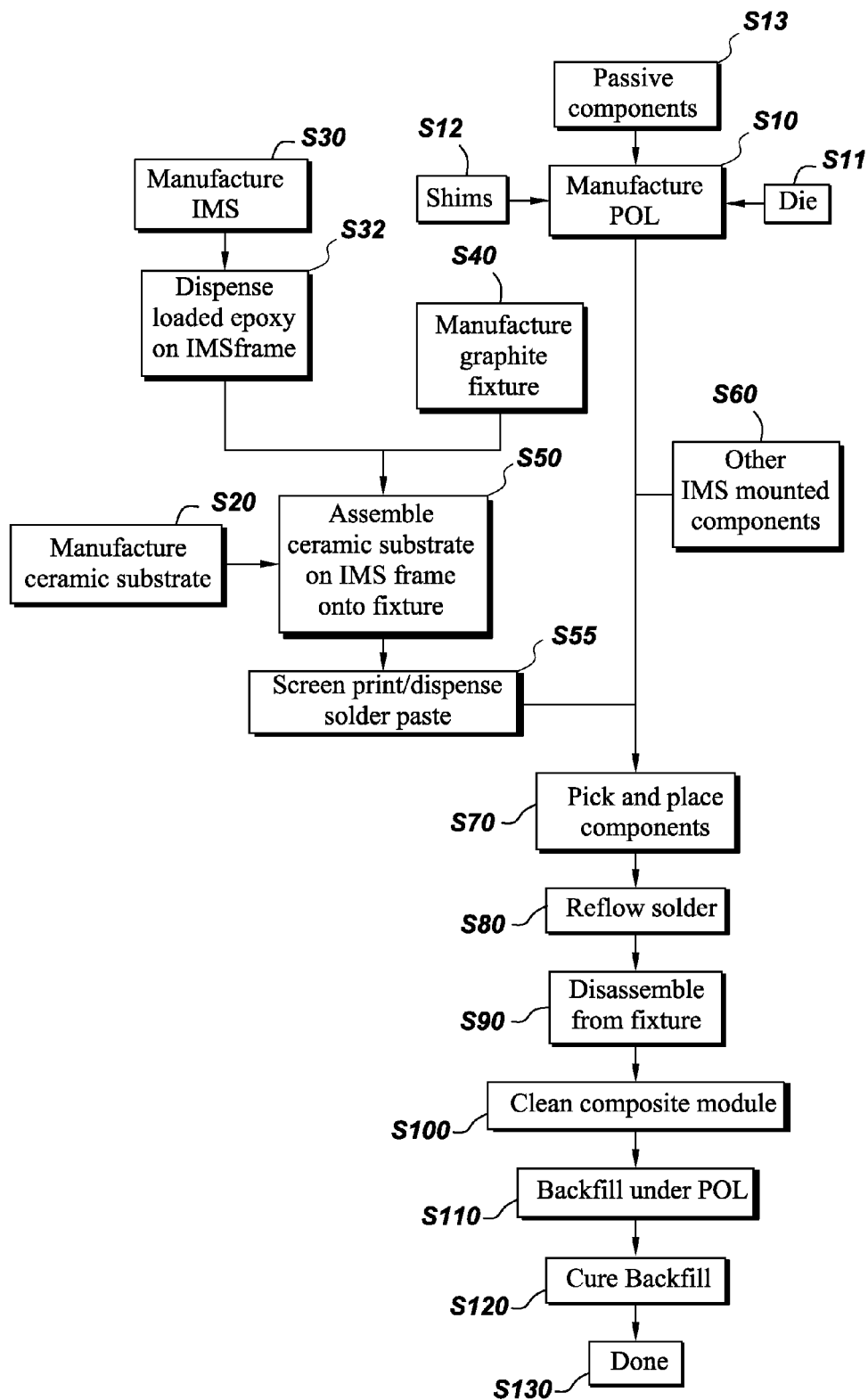
FIG. 7 is a flow chart illustrating a fabrication process of a power module, according to one example.

Referring to FIG. 7, a method or process for fabricating the power module 10 includes manufacturing or providing a POL in S10. The process may further include manufacturing or providing a die in S11, shims or interposers in S12, and passive components in S13. In S20, a ceramic substrate is manufactured or provided and in S30 an IMS is manufactured or provided. Loaded epoxy may be dispensed on the IMS in S32. A graphite fixture is manufactured or provided in S40 and in S50 the ceramic substrate and the IMS are assembled into the graphite fixture. In S55 solder paste is dispensed (e.g. screen printed) onto the assembled ceramic substrate and IMS in the graphite fixture.

In S60 the components of the IMS are mounted and in S70, the components of the power module are picked and placed on the assembled ceramic substrate and IMS. The solder is reflowed in S80, for example by conveying the graphite fixture with the assembled ceramic substrate and IMS through an oven. During the reflow of the solder, the loaded epoxy dispensed in S32 cures. In S90 the assembly is removed or disassembled from the graphite fixture and in S100 the composite power module is cleaned. In S110, epoxy is backfilled under the POL of the power module and in S120 the backfill is cured. The process ends in S130.

Although not limited to any of the disclosed examples, the method of FIG. 7 may be used to form, for example, the power modules shown in FIGS. 4 and 5. Another example of a method for forming a power module is shown in FIG. 8, which may be used to form, for example, the power module of FIG. 6.

Figure 8:
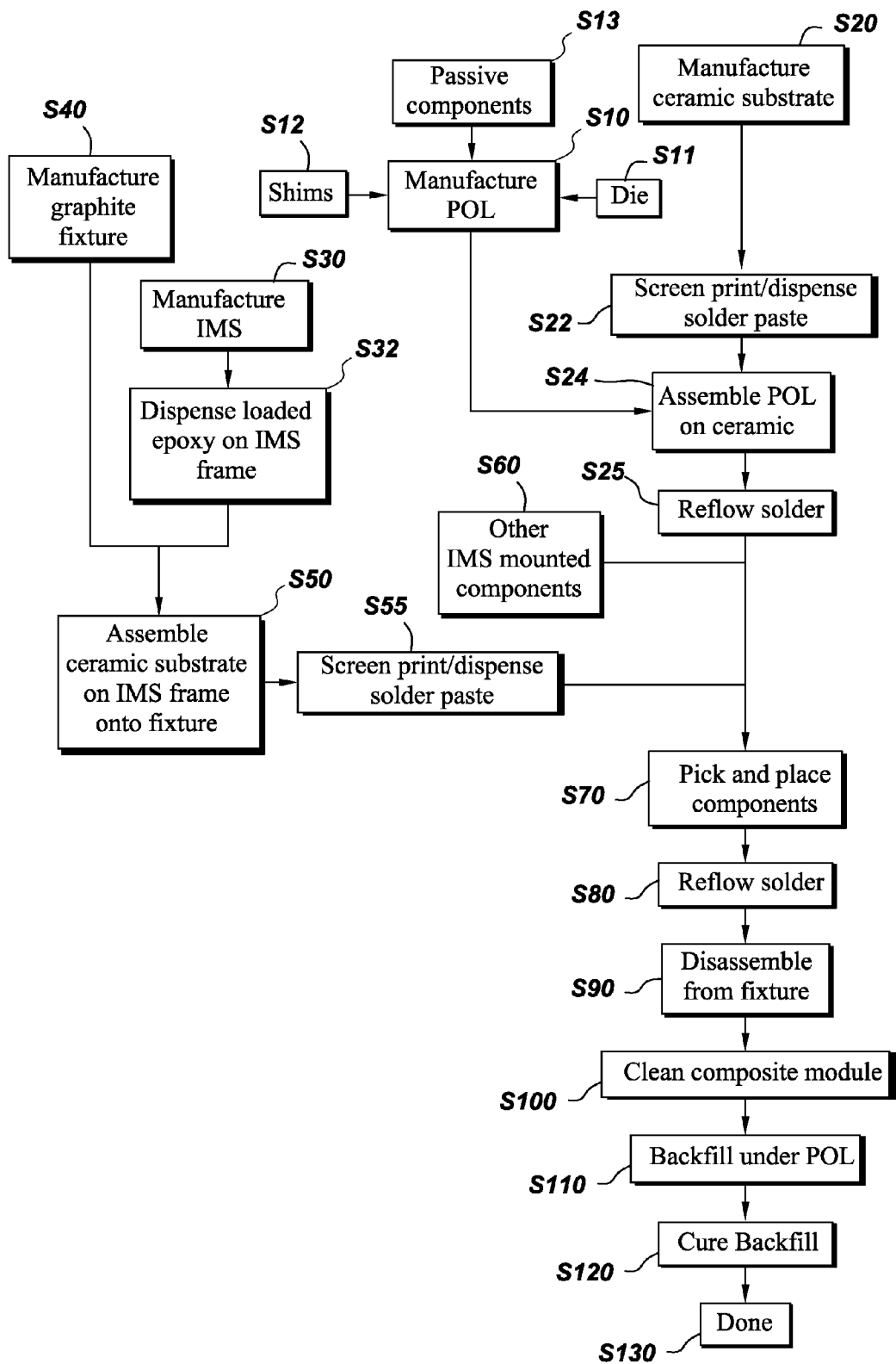
FIG. 8 is a flow chart illustrating a fabrication process of a power module, according to another example.

As shown in FIG. 8, in S22 solder past may be dispensed on the ceramic substrate and in S24 the POL may be assembled on the ceramic substrate. In S25 the solder may be reflowed. It should be appreciated that the solder reflow of S25 may be performed at a higher temperature than the solder reflow in S80. It should further be appreciated that the single solder reflow of FIG. 7 may be performed at a different temperature than the two solder reflows of FIG. 8. For example, the single solder reflow in S80 of FIG. 7 may be performed at about 200° C. and the solder reflow in S25 of FIG. 8 may be performed at about 240° C. and the solder reflow in S80 in FIG. 8 may be performed at about 180° C.

Thus, examples of the present technology provide an integrated power module using a composite substrate assembly including a ceramic substrate and an insulated metal substrate. As discussed previously, a power module using an IMS may result in cost effective high performing power conversion. However, thermal performance of such power modules, specially using IMS and POL combination, may not be good due to the poorly conducting insulating layer of the IMS. The present technology, thus, provides an integrated power module that uses a composite substrate that provides a combination of the cost effective high performance IMS with high thermal performance of a ceramic substrate for power devices.

While only certain features of the technology have been illustrated and described herein, many modifications and changes will occur to those skilled in the art. It is, therefore, to be understood that the appended claims are intended to cover all such modifications and changes.

The invention claimed is:

1. An integrated power module, comprising:
a substantially planar insulated metal substrate having at least one cut-out region;
at least one substantially planar ceramic substrate disposed within the cut-out region, wherein the ceramic substrate is framed on at least two sides by the insulated metal substrate, the ceramic substrate including a first metal layer on a first side and a second metal layer on a second side;
at least one power semiconductor device coupled to the first side of the ceramic substrate;
at least one control device coupled to a first surface of the insulated metal substrate;
a power overlay electrically connecting the at least one semiconductor power device and the at least one control device; and
a cooling fluid reservoir operatively connected to the second metal layer of the at least one ceramic substrate, wherein a plurality of cooling fluid passages are provided in the cooling fluid reservoir.

2. The integrated power module of claim 1, wherein the cooling fluid reservoir is integrally formed with the second metal layer of the at least one ceramic substrate.

3. The integrated power module of claim 1, wherein the cooling fluid passages are integrally formed in the second metal layer of the at least one ceramic substrate.

4. The integrated power module of claim 1, wherein the cooling fluid reservoir is attached to the second metal layer of the at least one ceramic substrate.

5. The integrated power module of claim 1, wherein the cooling fluid reservoir is attached to the second metal layer by solder.

6. The integrated power module of claim 1, further comprising a seal provided between the cooling fluid reservoir and the second metal layer.

7. The integrated power module of claim 1, wherein at least one gap is formed between the at least one ceramic substrate and the insulated metal substrate and the at least one gap is filled by filler material.

8. The integrated power module of claim 7, wherein the filler material comprises epoxy.

9. The integrated power module of claim 1, wherein the insulated metal substrate comprises a protrusion configured to engage the at least one ceramic substrate and exert pressure on the ceramic substrate.

10. The integrated power module of claim 1, further comprising at least one fastener configured to align and secure the insulated metal substrate to at least one heatsink.

11. The integrated power module of claim 1, further comprising a plurality of thermal vias provided between the second metal layer of the at least one ceramic substrate and extending through an insulating material layer of the insulated metal substrate.

* * * * *